(12) United States Patent
Lin et al.

(10) Patent No.: US 10,276,606 B2
(45) Date of Patent: Apr. 30, 2019

(54) ARRAY SUBSTRATE AND DISPLAY DEVICE AND METHOD FOR MAKING THE ARRAY SUBSTRATE

(71) Applicant: HON HAI PRECISION INDUSTRY CO., LTD., New Taipei (TW)

(72) Inventors: Hsin-Hua Lin, New Taipei (TW); Yi-Chun Kao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/681,254

(22) Filed: Aug. 18, 2017

(65) Prior Publication Data

US 2018/0006065 A1 Jan. 4, 2018

Related U.S. Application Data

(62) Division of application No. 15/194,772, filed on Jun. 28, 2016, now Pat. No. 9,768,204.

(Continued)

(51) Int. Cl.
*H01L 27/12* (2006.01)
*H01L 27/32* (2006.01)
(Continued)

(52) U.S. Cl.
CPC .... *H01L 27/1251* (2013.01); *H01L 21/26513* (2013.01); *H01L 27/127* (2013.01); *H01L 27/1225* (2013.01); *H01L 27/1233* (2013.01); *H01L 27/1237* (2013.01); *H01L 27/1255* (2013.01); *H01L 27/1259* (2013.01); *H01L 27/1288* (2013.01); *H01L 29/41733* (2013.01); *H01L 29/66757* (2013.01); *H01L 29/66969* (2013.01); *H01L 29/78675* (2013.01);
(Continued)

(58) Field of Classification Search
CPC ........................ H01L 27/1251; H01L 27/1237
See application file for complete search history.

(56) References Cited

U.S. PATENT DOCUMENTS

| | | | | |
|---|---|---|---|---|
| 6,582,875 B1 * | 6/2003 | Kay | .................... | B23K 26/0676 347/238 |
| 2004/0016924 A1 * | 1/2004 | Yamada | .............. | H01L 29/4908 257/59 |

(Continued)

FOREIGN PATENT DOCUMENTS

CN 104465697 A 3/2015

*Primary Examiner* — Yu Chen
*Assistant Examiner* — Vincent Wall
(74) *Attorney, Agent, or Firm* — ScienBiziP, P.C.

(57) ABSTRACT

A method for making an array substrate includes the following steps: forming a poly-silicon semiconductor layer on a substrate; forming a buffer layer on the substrate; depositing a first metal layer, and patterning the first metal layer to form gate electrodes for a driving TFT, a switch TFT, and a poly-silicon TFT; forming a first gate insulator layer; forming a second gate insulator layer; defining through holes passing through the buffer layer, the first gate insulator layer, and the second gate insulator layer to expose the poly-silicon semiconductor layer; depositing a metal oxide layer to form a first metal oxide semiconductor layer; and depositing a second metal layer to form source electrodes and drain electrodes for the driving TFT, the switch TFT, and the poly-silicon TFT.

10 Claims, 12 Drawing Sheets

Related U.S. Application Data

(60) Provisional application No. 62/220,259, filed on Sep. 18, 2015, provisional application No. 62/220,261, filed on Sep. 18, 2015, provisional application No. 62/220,257, filed on Sep. 18, 2015, provisional application No. 62/220,258, filed on Sep. 18, 2015.

(51) Int. Cl.
| | | |
|---|---|---|
| *H01L 29/49* | (2006.01) | |
| *H01L 29/66* | (2006.01) | |
| *H01L 21/265* | (2006.01) | |
| *H01L 29/417* | (2006.01) | |
| *H01L 29/786* | (2006.01) | |

(52) U.S. Cl.
CPC ...... *H01L 27/3262* (2013.01); *H01L 29/4908* (2013.01); *H01L 29/7869* (2013.01); *H01L 29/78621* (2013.01); *H01L 29/78678* (2013.01); *H01L 29/78696* (2013.01)

(56) References Cited

U.S. PATENT DOCUMENTS

| | | | |
|---|---|---|---|
| 2011/0266543 A1* | 11/2011 | Moriwaki | G02F 1/13624 257/59 |
| 2013/0043465 A1* | 2/2013 | Okazaki | H01L 29/7869 257/43 |
| 2015/0055047 A1* | 2/2015 | Chang | H01L 27/3262 349/43 |

* cited by examiner

ARRAY SUBSTRATE AND DISPLAY DEVICE AND METHOD FOR MAKING THE ARRAY SUBSTRATE

CROSS-REFERENCE TO RELATED APPLICATIONS

This application is a divisional application of U.S. Ser. No. 15/194,772, filed Jun. 28, 2016 the contents of which are hereby incorporated by reference. The patent application Ser. No. 15/194,772 in turn claims the benefit of priority under 35 USC 119 from U. S. Patent Application No. 62/220,261, 62/220,257, 62/220,258, 62/220,259, all filed on Sep. 18, 2015.

FIELD

The subject matter herein generally relates to an array substrate, a display device having the array substrate, and method for making the array substrate, more particularly to an array substrate for an organic light emitting diode (OLED) display device.

BACKGROUND

Two common kinds of display devices are a liquid crystal display (LCD) device and an OLED display device. The OLED display device usually includes a substrate, a pixel array, and a driving circuit formed on the substrate. The OLED fabrication process is prone to damage from the high temperature fabrication process which results in degradation in display performance and quality. Furthermore, there is room for improvement in display, operation, and luminance of an OLED device.

BRIEF DESCRIPTION OF THE DRAWINGS

Implementations of the present technology will now be described, by way of example only, with reference to the attached figures.

DETAILED DESCRIPTION

Figure 1:
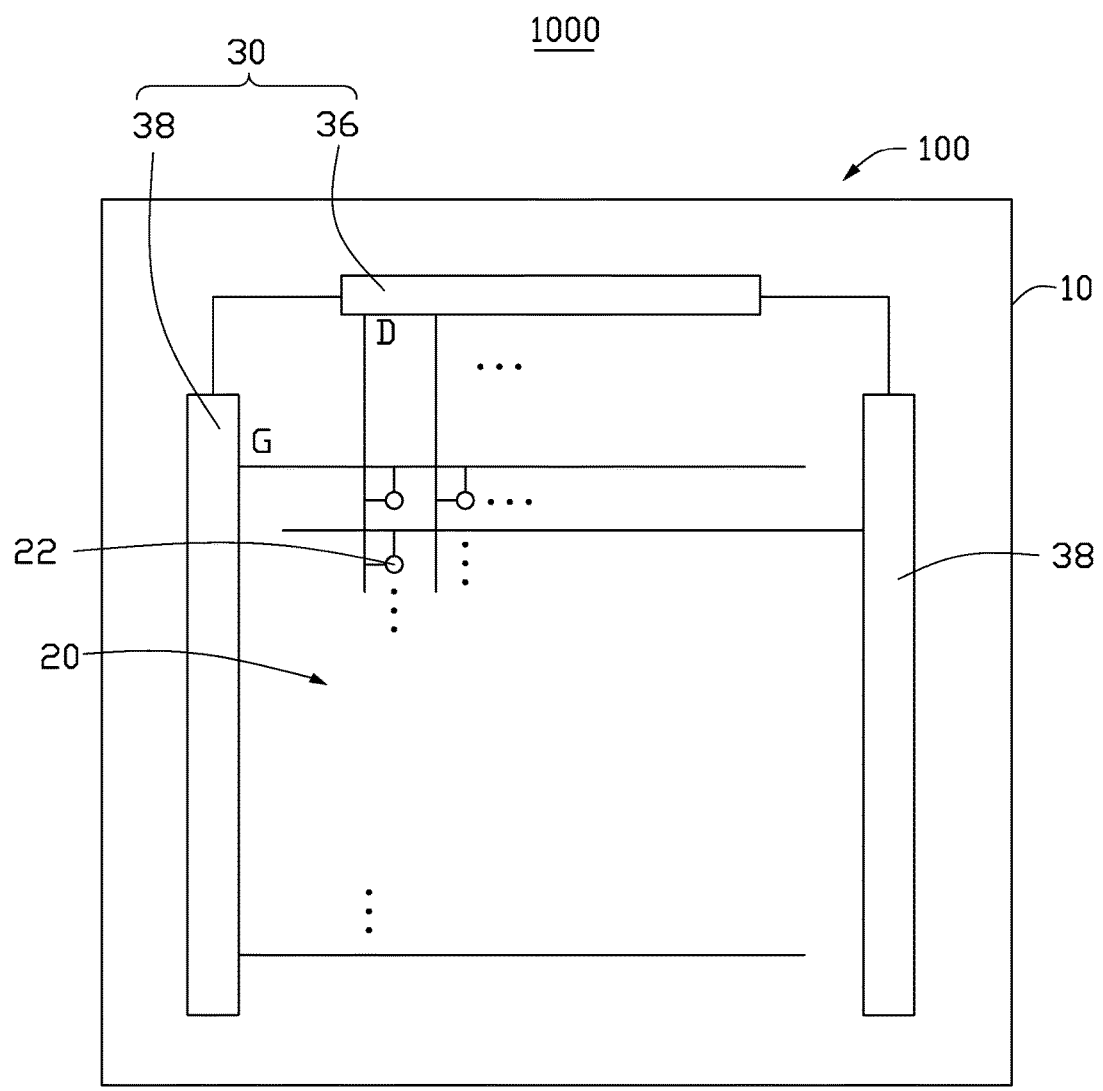
FIG. 1 is a plan view of an array substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a display device 1000. The display device 1000 is an OLED display device and comprises an array substrate 100. The array substrate 100 comprises a substrate 10, a pixel array 20, and a driving circuit 30. The pixel array 20 and the driving circuit 30 are formed on the substrate 10. The substrate 10 can be made of a material which is commonly used, such as glass, quartz, or flexible material. The pixel array 20 is configured to display images and comprises a plurality of pixel units 22 arranged in rows and columns. The driving circuit 30 comprises at least one gate driver 38 and at least one source driver 36. The driving circuit 30 comprises one or more thin film transistors formed on the substrate 10. The array substrate 100 is a hybrid thin film transistor (TFT) array substrate, and comprises low-temperature poly-silicon TFTs and metal oxide TFTs formed on the substrate 10.

Figure 2:
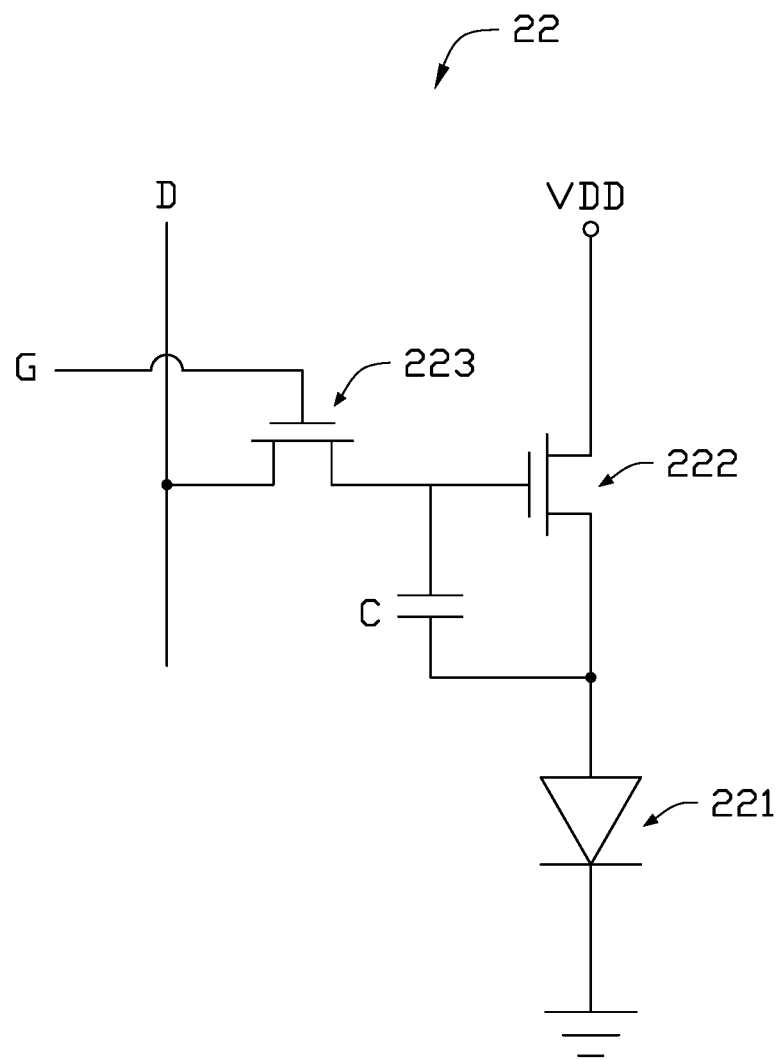
FIG. 2 is a circuit diagram of a pixel unit of FIG. 1.

FIG. 2 illustrates an equivalent circuit diagram of one of the pixel units 22. Each pixel unit 22 comprises a light emitting diode 221, a driving TFT 222, a switch TFT 223, and a capacitor C. The switch TFT 223 is electrically connected between the driving circuit 30 (shown as in FIG. 1) and the driving TFT 222 to switch the driving TFT 222 on or off. The driving TFT 222 is electrically connected between a power source VDD and the light emitting diode 221. The capacitor C is a storage capacitor and is electrically connected between a gate electrode of the driving TFT 222 and a drain electrode of the driving TFT 222. The capacitor C is configured to control an electrical current of the driving TFT 222, thus the driving TFT 222 can control a luminance of the light emitting diode 221. The driving TFT 222 is a metal oxide TFT. In this embodiment, a sub-threshold swing of the driving TFT 222 is larger than that of the switch TFT 223, which is obtained by adjusting the thicknesses of gate insulator layers in the driving TFT 222 and the switch TFT 223. The sub-threshold swing indicates the increment of applied voltage to the gate electrode for increasing electrical current of the drain electrode by one order of magnitude.

Figure 3:
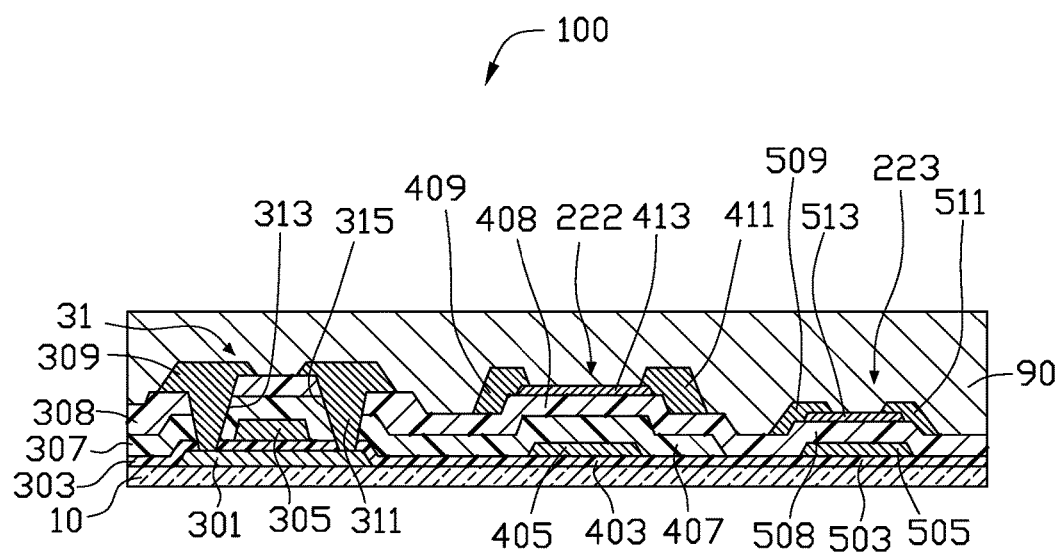
FIG. 3 is a cross-sectional view of a first exemplary embodiment of an array substrate.

FIG. 3 illustrates a cross-sectional view of a first embodiment of the array substrate 100 in part. The array substrate 100 comprises a plurality of poly-silicon TFTs 31, a plurality of switch TFTs 223, and a plurality of driving TFTs 222. FIG. 3 only shows one poly-silicon TFT 31, one switch TFT 223, and one driving TFT 222. The poly-silicon TFTs 31 may be included in the driving circuit 30 as switches to power on or power off the gate driver 38 and the source driver 36, and the poly-silicon TFTs 31 may also be included in the pixel units 22.

The light emitting diode 221 comprises an anode (not shown), a cathode (not shown), and light-emitting material (not shown) between the anode and the cathode. The anode is electrically coupled to the drain electrode of the driving TFT 222. The array substrate 100 further comprises dielectric layers (not shown) and a planar layer 90. The dielectric layers are formed on opposite sides of the light-emitting material. The planar layer 90 forms a top of the array substrate 100.

In this embodiment, the poly-silicon TFTs 31 are low-temperature poly-silicon TFTs, the switch TFTs 223 are metal oxide TFTs, and the driving TFTs 222 are metal oxide TFTs.

Each poly-silicon TFT 31 comprises a poly-silicon semiconductor layer 301, a buffer layer 303, a gate electrode 305, a first gate insulator layer 307, a second gate insulator layer 308, a source electrode 309, and a drain electrode 311. The poly-silicon semiconductor layer 301, the buffer layer 303, the gate electrode 305, the first gate insulator layer 307, and the second gate insulator layer 308 are stacked on the substrate 10 in that order. A first through hole 313 and a second through hole 315 passing through the buffer layer 303, the first gate insulator layer 307, and the second gate insulator layer 308 are therein defined. The source electrode 309 is formed on the second gate insulator layer 308 and extends through the first through hole 313 to couple to the poly-silicon semiconductor layer 301. The drain electrode 311 is formed on the second gate insulator layer 308 and extends through the second through hole 315 to couple to the poly-silicon semiconductor layer 301.

Each driving TFT 222 comprises a buffer layer 403, a gate electrode 405, a first gate insulator layer 407, a second gate insulator layer 408, a source electrode 409, a drain electrode 411, and a metal oxide semiconductor layer 413. The buffer layer 403, the gate electrode 405, the first gate insulator layer 407, the second gate insulator layer 408, and the metal oxide semiconductor layer 413 are stacked on the substrate 10 in that order. The source electrode 409 and the drain electrode 411 are defined by a single layer and are positioned at opposite sides of the metal oxide semiconductor layer 413. The metal oxide semiconductor layer 413 is coupled to the source electrode 409 and the drain electrode 411. The metal oxide semiconductor layer 413 may be made of indium gallium zinc oxide (IGZO), zinc oxide, indium oxide, or gallium oxide.

Each switch TFT 223 comprises a buffer layer 503, a gate electrode 505, a second gate insulator layer 508, a source electrode 509, a drain electrode 511, and a metal oxide semiconductor layer 513. The buffer layer 503, the gate electrode 505, the second gate insulator layer 508, and the metal oxide semiconductor layer 513 are stacked on the substrate 10 in that order. The source electrode 509 and the drain electrode 511 are defined by a single layer and are positioned at opposite sides of the metal oxide semiconductor layer 513. The metal oxide semiconductor layer 513 is coupled to the source electrode 509 and the drain electrode 511. The metal oxide semiconductor layer 513 may be made of IGZO, zinc oxide, indium oxide, or gallium oxide.

In this embodiment, the buffer layer 303, the buffer layer 403, and the buffer layer 503 are defined by a single layer and are formed by a single process. The first gate insulator layer 307 and the first gate insulator layer 407 are defined by a single layer and are formed by a single process. The second gate insulator layer 308, the second gate insulator layer 408, and the second gate insulator layer 508 are defined by a single layer and are formed by a single process. The first gate insulator layer 307 and the first gate insulator layer 407 are made of silicon nitride; and the second gate insulator layer 308, the second gate insulator layer 408, and the second gate insulator layer 508 are made of silicon oxide. Alternatively, the first gate insulator layer 307 and the first gate insulator layer 407 can be made of silicon oxide; and the second gate insulator layer 308, the second gate insulator layer 408, and the second gate insulator layer 508 can be made of silicon nitride.

Figure 4:
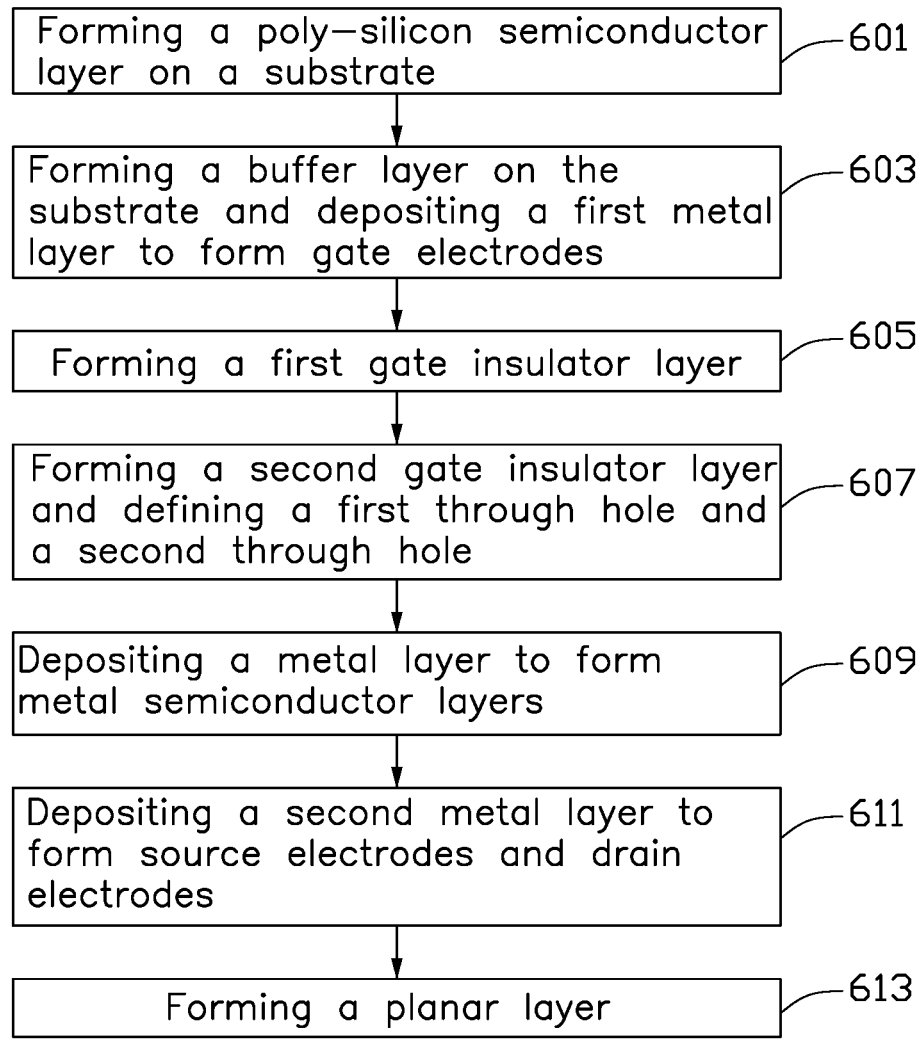
FIG. 4 is a flow chart of a method for making the array substrate of FIG. 3.

FIG. 4 illustrates a flow chart of an exemplary method for making the array substrate 100 shown in FIG. 3. The method is provided by way of example, as there are a variety of ways for carrying out the method. Each block shown in FIG. 4 represents one or more processes, methods, or subroutines, carried out in the exemplary method. The exemplary method can begin at block 601.

Figure 5:
FIG. 5 illustrates a step for manufacturing the array substrate of FIG. 3 at block 601 of FIG. 4.

At block 601, a poly-silicon semiconductor layer 301 is formed on a substrate 10, as shown FIG. 5. The process of forming the poly-silicon semiconductor layer 301 on the substrate 10 may comprise depositing an amorphous silicon layer, annealing, and ion doping the amorphous silicon layer. The substrate 10 can be made of a material which is commonly used, such as glass, quartz, or other flexible material.

Figure 6:
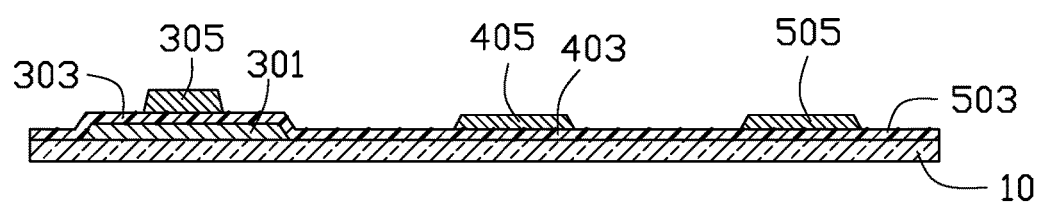
FIG. 6 illustrates a step for manufacturing the array substrate of FIG. 3 at block 603 of FIG. 4.

At block 603, as shown in FIG. 6, a buffer layer 303, a buffer layer 403, and a buffer layer 503 are formed on the substrate 10. A gate 305 is then formed on the buffer layer 303, a gate 405 is formed on the buffer layer 403, and a gate 505 is formed on the buffer layer 503. The buffer layer 303 covers the poly-silicon semiconductor layer 301. The buffer layer 303, the buffer layer 403, and the buffer layer 503 are made of an electrically insulative material. An electrically insulative material is deposited or coated on the substrate 10 to form the buffer layer 303, the buffer layer 403, and the buffer layer 503. The process of forming the gate 305, the gate 405, and the gate 505 on the substrate 10 may comprise depositing a first metal layer on the buffer layer 303, the buffer layer 403, and the buffer layer 503, and etching and patterning the first metal layer to form the gate 305, the gate 405, and the gate 505. The metal layer can be made of an electrically conductive metal, such as molybdenum (Mo), aluminum (Al), chromium (Cr), copper (Cu), or neodymium (Nd). The etching process can be a photolithographic etching process.

Figure 7:
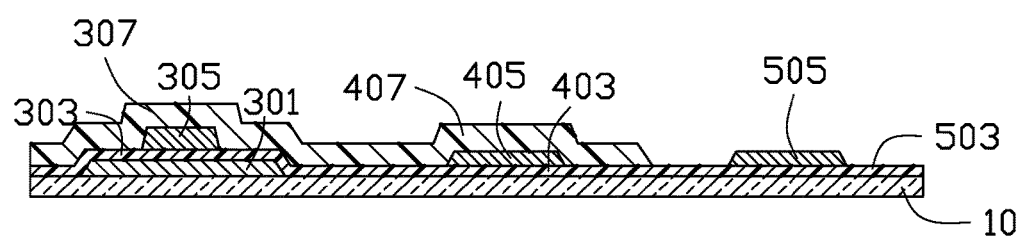
FIG. 7 illustrates a step for manufacturing the array substrate of FIG. 3 at block 605 of FIG. 4.

At block 605, as shown in FIG. 7, a first gate insulator layer 307 and a first gate insulator layer 407 are formed. The process of forming the first gate insulator layer 307 and the first gate insulator layer 407 may comprise depositing a first insulator layer on the substrate 10, the gate 305, the gate 405, and the gate 505, and removing a portion of the insulator layer which covers the gate 505. The first insulator layer is made of silicon nitride or silicon oxide. In this embodiment, the first insulator layer is made of silicon nitride.

Figure 8:
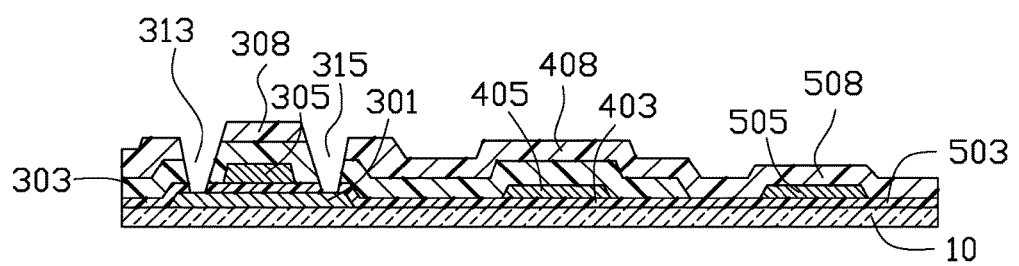
FIG. 8 illustrates a step for manufacturing the array substrate of FIG. 3 at block 607 of FIG. 4.

At block 607, as shown in FIG. 8, a second gate insulator layer 308, a second gate insulator layer 408, and a second gate insulator layer 508 are formed, and a first through hole 313 and a second through hole 315 are created to expose the poly-silicon semiconductor layer 301. The second gate insulator layer 308 is formed on the first gate insulator layer 307, the second gate insulator layer 408 is formed on the first gate insulator layer 407, and the second gate insulator layer 508 is formed on the buffer layer 503, and covers the gate 505. Both the first through hole 313 and the second through hole 315 pass through the second gate insulator layer 308, the first gate insulator layer 307, and the buffer layer 303. The second insulator layer is made of silicon nitride or silicon oxide. In this embodiment, the second insulator layer is made of silicon oxide.

Figure 9:
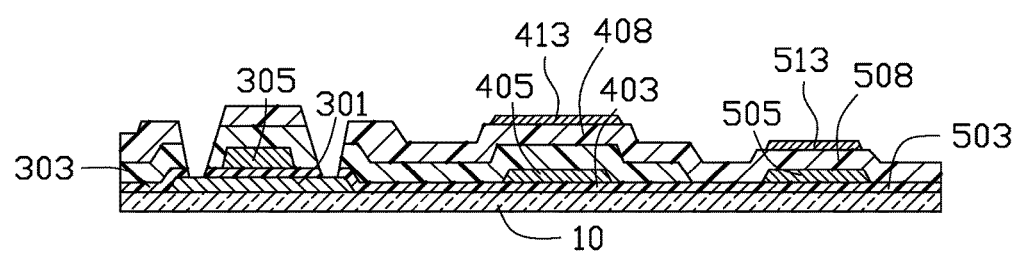
FIG. 9 illustrates a step for manufacturing the array substrate of FIG. 3 at block 609 of FIG. 4.

At block 609, as shown in FIG. 9, a metal oxide semiconductor layer 413 and a metal oxide semiconductor layer 513 are formed. The process of forming the metal oxide semiconductor layer 413 and the metal oxide semiconductor layer 513 may comprise depositing a metal oxide layer, and patterning the metal oxide layer to form the metal oxide semiconductor layer 413 and the metal oxide semiconductor layer 513. The metal oxide semiconductor layer 413 is formed on the second gate insulator layer 408 and corresponds to the gate 405. The metal oxide semiconductor layer 513 is formed on the second gate insulator layer 508 and corresponds to the gate 505. Both the metal oxide semiconductor layer 413 and the metal oxide semiconductor layer 513 can be made of IGZO, zinc oxide, indium oxide, or gallium oxide.

Figure 10:
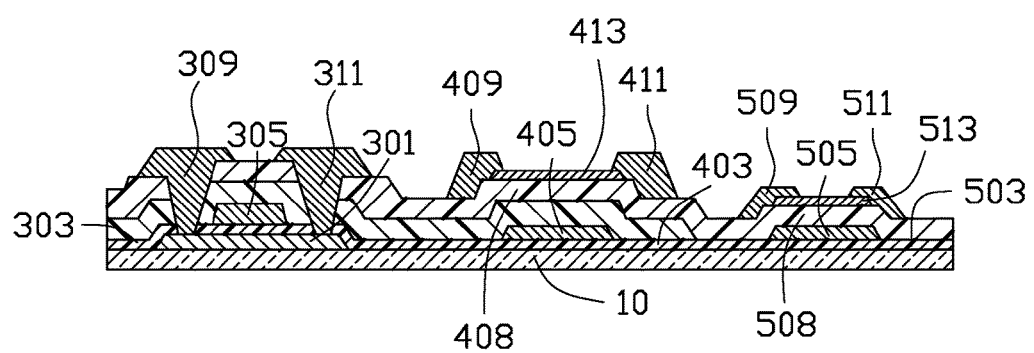
FIG. 10 illustrates a step for manufacturing the array substrate of FIG. 3 at block 611 of FIG. 4.

At block 611, as shown in FIG. 10, a source electrode 309, a source electrode 409, a source electrode 509, a drain electrode 311, a drain electrode 411, and a drain electrode 511 are formed. The process of forming the source electrode 309, the source electrode 409, the source electrode 509, the drain electrode 311, the drain electrode 411, and the drain electrode 511 may comprise depositing a second metal oxide layer and etching and patterning the second metal layer to form the source electrode 309, the source electrode 409, the source electrode 509, the drain electrode 311, the drain electrode 411, and the drain electrode 511. The source electrode 309 is formed in the first through hole 313, and the drain electrode 311 is formed in the second through hole 315. The source electrode 309 and the drain electrode 311 are coupled to the poly-silicon semiconductor layer 301. The source electrode 409 and the drain electrode 411 are coupled to the metal oxide semiconductor layer 413. The source electrode 509 and the drain electrode 511 are coupled to the metal oxide semiconductor layer 513.

At block 613, as shown in FIG. 3, a planar layer 90 is formed to cover the poly-silicon TFT 31, the switch TFT 223, and the driving TFT 222. The method further comprises forming an anode (not shown), a cathode (not shown), and a light-emitting material (not shown) for the light emitting diode 221.

In this embodiment, the poly-silicon TFTs 31 are low-temperature poly-silicon TFTs, which can be positioned in a non-display region of the display device 1000. The poly-silicon TFTs 31 have high electron mobility and can improve a reaction rate of the driving circuit. The poly-silicon TFTs 31 have a small volume, allowing a narrowing of the non-display region.

The switch TFT 223 comprises only one gate insulator layer and the driving TFT 222 comprises two gate insulator layers. That is, the thicknesses of the gate insulator layers of the driving TFT 222 is greater than that of the switch TFT 223, thus a gate capacitance of the driving TFT 222 is less than that of the switch TFT 223, and a sub-threshold swing of the driving TFT 222 is higher than that of the switch TFT 223. Therefore, the driving TFT 222 can, with very fine precision, control the luminance of the light emitting diode 221, and the switch TFT 223 can reduce operating voltage and increase operating rate of the circuit.

Figure 11:
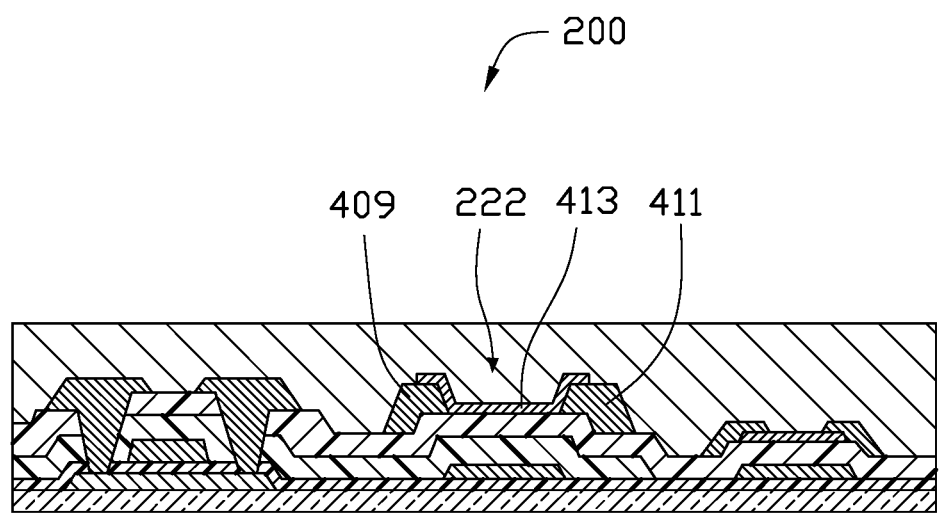
FIG. 11 is a cross-sectional view of a second exemplary embodiment of an array substrate.

FIG. 11 illustrates a cross-sectional view of a second embodiment of an array substrate (array substrate 200) in part. The array substrate 200 is substantially the same as the array substrate 100, except that the metal oxide semiconductor layer 413 of the driving TFT 222 is formed on the second gate insulator layer 408, the source electrode 409 and the drain electrode 411, and partially covers the source electrode 409 and the drain electrode 411. In the array substrate 100, the source electrode 409 and the drain electrode 411 partially cover the metal oxide semiconductor layer 413. In the array substrate 200, the metal oxide semiconductor layer 413 is formed after the source electrode 409 and the drain electrode 411 have been formed, this protects the metal oxide semiconductor layer 413 from damage during the process of forming the source electrode 409 and the drain electrode 411.

Figure 12:
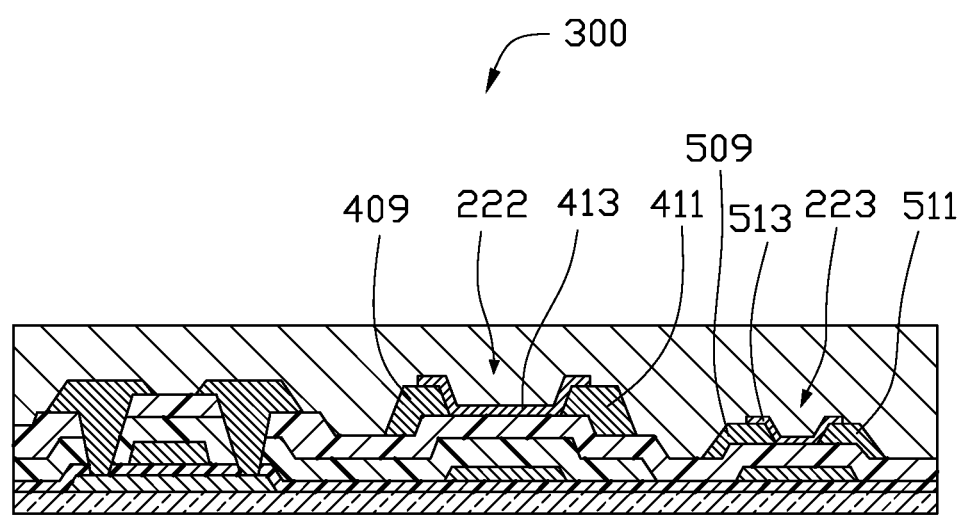
FIG. 12 is a cross-sectional view of a third exemplary embodiment of an array substrate.

FIG. 12 illustrates a cross-sectional view of a third embodiment of an array substrate (array substrate 300) in part. The array substrate 300 is substantially the same as the array substrate 100, except that the metal oxide semiconductor layer 413 of the driving TFT 222 is formed on the second gate insulator layer 408, the source electrode 409, and the drain electrode 411, and partially covers the source electrode 409 and the drain electrode 411; and the metal oxide semiconductor layer 513 of the switch TFT 223 is formed on the second gate insulator layer 508, the source electrode 509 and the drain electrode 511, and partially covers the source electrode 509 and the drain electrode 511. In the array substrate 100, the source electrode 409 and the drain electrode 411 partially cover the metal oxide semiconductor layer 413; and the source electrode 509 and the drain electrode 511 partially cover the metal oxide semiconductor layer 513. In the array substrate 300, the metal oxide semiconductor layer 413 is formed after the source electrode 409 and the drain electrode 411 have been formed. The metal oxide semiconductor layer 513 is formed after the source electrode 509 and the drain electrode 511 have been formed.

The embodiments shown and described above are only examples. Many details are often found in the art such as other features of a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for making an array substrate comprising:
   forming a poly-silicon semiconductor layer on a substrate;
   forming a buffer layer on the substrate and covering the poly-silicon semiconductor layer;
   depositing a first metal layer and patterning the first metal layer to form a first gate electrode for a driving TFT, a second gate electrode for a switch TFT, and a third gate electrode for a poly-silicon TFT, the third gate electrode overlapping with the poly-silicon semiconductor layer;
   forming a first gate insulator layer covering the third gate electrode and the first gate electrode;
   forming a second gate insulator layer covering the first gate insulator layer and the second gate electrode;
   defining a first through hole and a second through hole in the second gate insulator layer, the first through hole and the second through hole passing through the buffer layer, the first gate insulator layer, and the second gate insulator layer to expose the poly-silicon semiconductor layer;

depositing a metal oxide layer on the second gate insulator layer and patterning the metal oxide layer to form a first metal oxide semiconductor layer and a second metal oxide semiconductor layer, the first metal oxide semiconductor layer overlapping with the first gate electrode and the second metal oxide semiconductor layer overlapping with the second gate electrode; and depositing a second metal layer and patterning the second metal layer to form a first source electrode, a first drain electrode, a second source electrode, a second drain electrode, a third source electrode, and a third drain electrode, the first source electrode and the first drain electrode coupled to the first metal oxide semiconductor layer of the driving TFT, the second source electrode and the second drain electrode coupled to the second metal oxide semiconductor layer of the switch TFT, and the third source electrode in the first through hole and the third drain electrode in the second through hole;

wherein the first gate insulator layer does not cover the second gate electrode;

wherein a portion of the second gate insulator layer is between the second gate electrode and the second metal oxide semiconductor layer, wherein the second gate insulator layer is in direct contact with both the second gate electrode and the second metal oxide semiconductor layer;

wherein a portion of the first gate insulator layer and another portion of the second gate insulator layer is between the first gate electrode and the first metal oxide semiconductor layer.

2. The method of claim 1, further comprising forming a planar layer covering the poly-silicon TFT, the switch TFT, and the driving TFT.

3. The method of claim 1, wherein the first metal oxide semiconductor layer partially covers the first source electrode and the first drain electrode.

4. The method of claim 1, wherein the second metal oxide semiconductor layer partially covers the second source electrode and the second drain electrode.

5. The method of claim 1, wherein forming the poly-silicon semiconductor layer on the substrate comprises depositing an amorphous silicon layer on the substrate, annealing the amorphous silicon layer, and ion doping the amorphous silicon layer.

6. The method of claim 1, wherein the substrate is made of glass or quartz.

7. The method of claim 1, wherein the substrate is a flexible material.

8. The method of claim 1, wherein the first gate insulator layer is made of silicon nitride.

9. The method of claim 1, wherein the second gate insulator layer is made of silicon oxide.

10. The method of claim 1, wherein the metal oxide layer is made of indium gallium zinc oxide, zinc oxide, indium oxide, or gallium oxide.

\* \* \* \* \*